(12) United States Patent
Lim et al.

(10) Patent No.: US 8,581,334 B2
(45) Date of Patent: Nov. 12, 2013

(54) VIA STRUCTURES AND SEMICONDUCTOR DEVICES HAVING THE VIA STRUCTURES

(75) Inventors: Dong-Chan Lim, Suwon-si (KR); Gil-Heyun Choi, Seoul (KR); Byung-Lyul Park, Seoul (KR); Sang-Hoon Ahn, Hwaseong-si (KR); Jong-Myeong Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 300 days.

(21) Appl. No.: 12/910,019

(22) Filed: Oct. 22, 2010

(65) Prior Publication Data
US 2011/0108988 A1 May 12, 2011

(30) Foreign Application Priority Data
Nov. 9, 2009 (KR) .................. 10-2009-0107570

(51) Int. Cl.
*H01L 29/66* (2006.01)
*H01L 21/02* (2006.01)

(52) U.S. Cl.
USPC .......................................... 257/330; 257/532

(58) Field of Classification Search
USPC ........................................................ 438/639
See application file for complete search history.

(56) References Cited

U.S. PATENT DOCUMENTS

2008/0023756 A1* 1/2008 Lee ................................ 257/330
2010/0181645 A1* 7/2010 Marenco ........................ 257/532

FOREIGN PATENT DOCUMENTS

| KR | 10-2005-0059736 | 6/2005 |
| KR | 10-2007-0006667 | 1/2007 |
| KR | 10-2008-0014095 | 2/2008 |

* cited by examiner

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

A via structure may include a first conductive pattern, a buffer pattern, and a second conductive pattern. The first conductive pattern may be on an inner wall of a first substrate and the inner wall may define a via hole passing at least partially through the first substrate. The buffer pattern may be on the first conductive pattern and the buffer pattern may partially fill the via hole. The second conductive pattern may be on a top surface of the buffer pattern in the via hole.

13 Claims, 9 Drawing Sheets

VIA STRUCTURES AND SEMICONDUCTOR DEVICES HAVING THE VIA STRUCTURES

CROSS REFERENCE TO RELATED APPLICATIONS

This application claims priority under 35 USC §119 to Korean Patent Application No. 2009-107570, filed on Nov. 9, 2009 in the Korean Intellectual Property Office (KIPO), the contents of which are herein incorporated by reference in their entirety.

BACKGROUND

1. Field

Example embodiments relate to via structures, methods of forming the same, semiconductor devices having the via structures, and methods of manufacturing the same. More particularly, example embodiments relate to via structures through a substrate, methods of forming the same, semiconductor devices having the via structures, and methods of manufacturing the same.

2. Description of the Related Art

As a semiconductor device has been highly integrated, a 3-dimensional integration method has been introduced to provide a memory device with a high capacity. For a stacked semiconductor device, through-silicon via (TSV) technology has been researched to replace a wire bonding technology which is a conventional method for electrical connection. The TSV technology is characterized as forming a via hole through a substrate and a via structure in the via hole.

When a high temperature process is performed on the substrate, a conductive material of the via structure, e.g., a metal in the via hole may expand in volume. A thermal expansion of the conductive material may differ from that of the substrate, and thus the conductive material may protrude from the via hole. A height of the protrusion may be very large, e.g., about a few micrometers. Due to the protrusion, layers on the via structure may be lifted, or have a crack therein. Thus, a semiconductor device having the via structure may have poor reliability.

SUMMARY

Example embodiments provide a via structure having a top surface coplanar with that of a substrate.

Example embodiments provide a method of forming a via structure having a top surface coplanar with that of a substrate.

Example embodiments provide a semiconductor device including a via structure having a top surface coplanar with that of a substrate.

Example embodiments provide a method of manufacturing a semiconductor device including a via structure having a top surface coplanar with that of a substrate.

In accordance with example embodiments, a via structure may include a first conductive pattern, a buffer pattern, and a second conductive pattern. In example embodiments the first conductive pattern may be on an inner wall of a first substrate, the inner wall defining via hole passing at least partially through the first substrate. In example embodiments the buffer pattern may be on the first conductive pattern and the buffer pattern may partially fill the via hole. In example embodiments, the second conductive pattern may be on a top surface of the buffer pattern in the via hole.

In accordance with example embodiments, a method of manufacturing a via structure may include forming a via hole through at least a portion of a first substrate, forming a first conductive layer pattern on an inner wall of the via hole, forming a buffer pattern on the first conductive layer pattern to partially fill the via hole, and forming a second conductive layer pattern on the buffer pattern to fill a remaining portion of the via hole.

In accordance with example embodiments, there is provided a via structure. The via structure may include a substrate, a first conductive pattern, a buffer pattern and a second conductive pattern. The substrate includes a via hole. The first conductive pattern may be formed on an inner wall of the via hole. The buffer pattern may be formed on the first conductive pattern, and the buffer pattern may partially fill the via hole. The second conductive pattern may be formed on a top surface of the buffer pattern in the via hole.

In example embodiments, the via structure may further include a first barrier layer pattern between a first conductive pattern and the buffer pattern.

In example embodiments, the via structure may further include a second barrier layer pattern under the second conductive pattern.

In example embodiments, the buffer pattern may include a material having a lower thermal expansion coefficient than that of the first conductive pattern.

In example embodiments, the buffer pattern may include silicon, an oxide, or a metal.

In example embodiments, the via structure may further include semiconductor circuit patterns on the substrate and a first insulating interlayer covering the semiconductor circuit patterns.

In example embodiments, the via hole may be formed through the first insulating interlayer and at least a portion of the substrate.

In example embodiments, the via structure may further include a capping layer covering the first insulating interlayer, and the first and second conductive patterns.

In example embodiments, the first and second conductive patterns may include copper.

In example embodiments, the via hole may have a depth of about 10 to about 100 μm.

According to example embodiments, there is provided a method of manufacturing a via structure. In the method, a via hole may be formed through at least a portion of a substrate. A first conductive layer pattern may be formed on an inner wall of the via hole. A buffer pattern may be formed on the first conductive layer pattern to partially fill the via hole. A second conductive layer pattern may be formed on the buffer pattern to fill a remaining portion of the via hole.

In example embodiments, a buffer layer may be formed on the first conductive layer pattern to fill the via hole. An upper portion of the buffer layer may be removed to have a top surface lower than that of the substrate.

In example embodiments, semiconductor circuit patterns may be formed on the substrate. A first insulating interlayer may be formed on the substrate to cover the semiconductor circuit patterns.

In example embodiments, a capping layer and a second insulating interlayer may be formed on the first insulating interlayer, and the first and second conductive patterns.

In example embodiments, a thermal process may be performed on the substrate at a temperature of higher than about 400° C. after the second conductive layer pattern is formed.

In example embodiments, an insulation layer pattern may be formed on an inner wall of the via hole to insulate the substrate from the first conductive layer pattern.

In example embodiments, a first barrier layer pattern may be formed on the first conductive layer pattern.

In example embodiments, a second barrier layer pattern may be formed on a top surface of the buffer pattern and the first conductive layer pattern.

According to some example embodiments, there is provided a semiconductor device. The semiconductor device may include a first substrate, first and second circuit patterns, a first conductive pattern, a buffer pattern, and a second conductive pattern. The first substrate has a via hole through the first substrate. The first circuit pattern is on the first substrate. The second circuit pattern is formed on a second substrate, and the second circuit pattern has a pad electrode. The first conductive pattern has a cup shape on an inner wall and at a bottom portion of the via hole, and a bottom portion of the first conductive pattern contacts a top surface of the pad electrode. The buffer pattern may be for lied on the first conductive pattern, and may fill the via hole. The second conductive pattern may be formed on the buffer pattern, and may fill a remaining portion of the via hole.

According to example embodiments, there is provided a method of manufacturing a semiconductor device. In the method, a first a first circuit pattern may be formed on a first preliminary substrate. A via hole may be formed through at least a portion of the first preliminary substrate. A via structure may be formed in the via hole. The via structure may include a buffer pattern and first and second conductive patterns. The first conductive pattern may be formed on an inner wall of the via hole. The buffer pattern may be formed on the first conductive pattern, and may partially fill the via hole. The second conductive pattern may be formed on the buffer pattern, and may fill a remaining portion of the via hole. A lower portion of the preliminary first substrate may be removed until a bottom surface of the via structure is exposed to form a first substrate. A second circuit may be formed on a second substrate having a pad electrode. The first and second substrates may be connected by attaching the pad electrode of the second substrate to the first conductive pattern of the via structure of the first substrate.

Accordingly, a via structure in accordance with example embodiments may include a material having a relatively low thermal expansion coefficient, so that the via structure may be prevented from protruding in high temperature processes. Therefore, semiconductor devices having the via structure may have high reliability.

BRIEF DESCRIPTION OF THE DRAWINGS

Example embodiments will be more clearly understood from the following detailed description taken in conjunction with the accompanying drawings. FIGS. 1 to 16 represent non-limiting, example embodiments as described herein.

DETAILED DESCRIPTION OF THE EMBODIMENTS

Example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
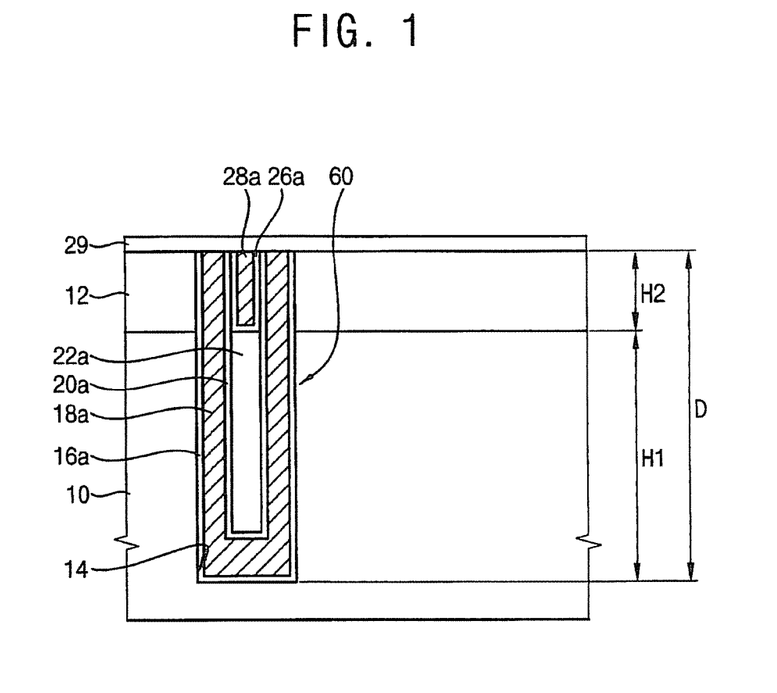
FIG. 1 is a cross-sectional view illustrating a via structure in accordance with example embodiments.

FIG. 1 is a cross-sectional view illustrating a via structure in accordance with example embodiments.

Referring to FIG. 1, circuit patterns (not shown) may be formed on a substrate 10. The substrate 10 may include a semiconductor material, for example, silicon, germanium, and silicon-germanium. The circuit patterns may include one or more semiconductor devices, for example, transistors and/or diodes. An insulating interlayer 12 covering the circuit patterns may be formed on the substrate 10.

A via hole 14 may be formed through the insulating interlayer 12 and at least a portion of the substrate 10. The via hole 14 may have a depth of about 10 to about 100 µm, for example, about 30 to about 60 µm. The via hole 14 may have a diameter of about 5 to about 30 µm, for example, about 10 to about 20 µm.

A first insulation layer pattern 16a may be formed on an inner wall of the via hole 14. The first insulation layer pattern 16a may include an oxide, for example, a silicon oxide. The first insulation layer pattern 16a may electrically insulate the substrate 10 from a conductive material in the via hole 14.

A first barrier layer pattern (not shown) may be formed on the first insulation layer pattern 16a. The first barrier layer pattern may include tantalum, tantalum nitride, titanium, titanium nitride, ruthenium, cobalt, etc. These may be used alone or in combination thereof.

A first seed pattern (not shown) may be further formed on the first barrier layer pattern. Alternatively, the first seed pattern may not be formed according to the kind of a first conductive pattern 18a in the via hole 14 or a process of forming the first conductive pattern 18a.

The first conductive pattern 18a may be formed on the first seed pattern. The first conductive pattern 18a may be formed directly on the barrier layer pattern when the first seed layer is not formed. In an example embodiment, the first conductive pattern 18a may have a cup shape. The first conductive pattern 18a may include a metal having a low resistance, for example, copper.

A second barrier layer pattern 20a may be formed on the first conductive pattern 18a. The second barrier layer pattern 20a may include tantalum, tantalum nitride, titanium, titanium nitride, ruthenium, cobalt, etc. These may be used alone or in combination thereof. The second barrier layer pattern 20a may prevent or retard a reaction between the first conductive pattern 18a and a buffer pattern 22a on the second barrier layer pattern 20a, and partially fill the via hole 14. According to the kind of the materials of the first conductive pattern 18a and the buffer pattern 22a, the reaction therebetween may not occur. In this case, the second barrier layer pattern 20a may not be formed.

The buffer pattern 22a may be formed on the second barrier layer pattern 20a, and partially fill the via hole 14. In example embodiments, the buffer pattern 22a may fill a central portion of the via hole 14.

The buffer pattern 22a may reduce a thermal expansion mismatch between the first conductive pattern 18a and the substrate 10, thereby suppressing protrusion of the first conductive pattern 18a. Thus, the buffer pattern 22a may include a material having a lower thermal expansion coefficient than that of the first conductive pattern 18a. In example embodiments buffer pattern 22a may have a thermal expansion coefficient of less than about $16.7 \times 10^{-6}/°$ C. at a room temperature. In example embodiments, the buffer pattern 22a may include a material of which a volume decreases when the material is heated. The buffer pattern 22a may include a conductive or an insulative material. For example, the buffer pattern 22a may include an oxide, for example, spin-on glass (SOG), a flowable silicon, and/or a metal, for example titanium and/or aluminum, and a porous material.

A second height H2 of a second conductive pattern 28a over the buffer pattern 22a may decrease according as a first height H1 of the buffer pattern 22a increases. When the second height H2 of the second conductive pattern 28a is relatively small, the first and second conductive patterns 18a and 28a may protrude less from a top surface of the insulating interlayer 12. Thus, the buffer pattern 22a may need to have a relatively large first height H1 in order to suppress the protrusion of a via structure 60. When the first height H1 of the buffer pattern 22a is too large, the via structure 60 may have an increased resistance due to a decreased second height H2 of the second conductive pattern 28a. Thus, the first height H1 of the buffer pattern 22a may be larger than about 50 percent of a depth D of the via hole 14, preferably. The second height H2 of the second conductive pattern 28a may be less than 20 µm.

A third barrier layer pattern 26a and a second seed pattern (not shown) may be formed on a top surface of the buffer pattern 22a and a sidewall of the second barrier layer pattern 20a. The third barrier layer pattern 26a may include tantalum, tantalum nitride, titanium, titanium nitride, ruthenium, and/or cobalt. These may be used alone or in combination thereof and example embodiments are not limited thereto. The third barrier layer pattern 26a may prevent or retard a reaction between the buffer pattern 22a and a second conductive pattern 28a that may be on the third barrier layer pattern 26 and fill the via hole 14. According to the kind of the materials of the buffer pattern 22a and the second conductive pattern 28a, the reaction therebetween may not occur. Accordingly, in example embodiments the third barrier layer pattern 26a may not be formed.

The second conductive pattern 28a may be formed on the second seed pattern to fill the remaining portion of the via hole 14. A top surface of the second conductive pattern 28a may be coplanar with a top surface of the insulating interlayer 12. In example embodiments, the second conductive pattern 28a may have a material substantially the same as that of the first conductive pattern 18a.

A capping layer 29 may be formed on the first and second conductive patterns 18a and 28a, the first insulation layer pattern 16a, the second and third barrier layer patterns 20a and 26a, and the insulating interlayer 12. In example embodiments, the capping layer 29 may include silicon nitride.

According to example embodiments, the via structure 60 may include the first and second conductive patterns 18a and 28a on the inner wall and at a top portion of the via hole 14, and the buffer pattern 22a at a central portion of the via structure 60.

The buffer pattern 22a may suppress the thermal expansion of the first and second conductive patterns 18a and 28a in the via structure 60. Thus, the conductive patterns 18a and 28a may not be protruded, so that the capping layer 29 on the via structure 60 may not be lifted upward or have cracks therein.

FIGS. 2 to 8 are cross-sectional views illustrating a method of forming a via structure in accordance with example embodiments.

Figure 2:
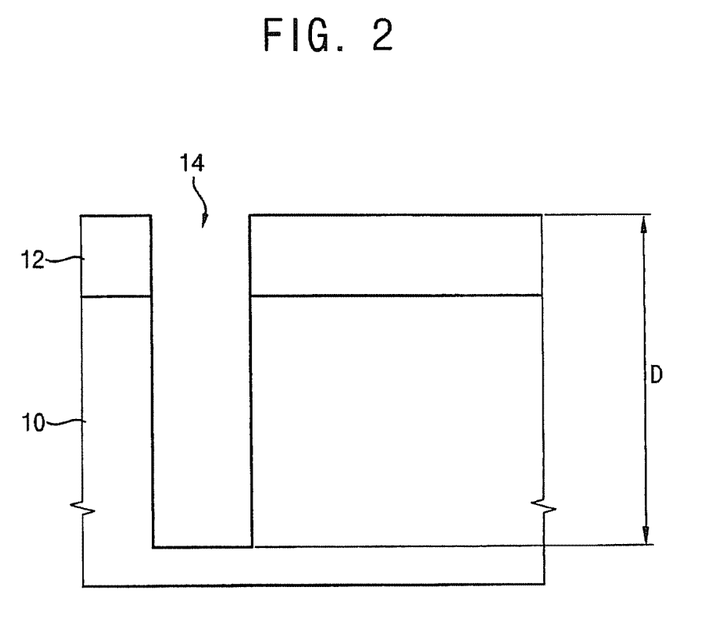
FIGS. 2 to 8 are cross-sectional views illustrating a method of forming a via structure in accordance with example embodiments.

Referring to FIG. 2, circuit patterns (not shown) may be formed on a substrate 10. The substrate 10 may include a semiconductor material, for example, silicon, germanium, and/or silicon-germanium. An insulating interlayer 12 may be formed on the substrate 10 to cover the circuit patterns. In example embodiments, front-end-of-line (FEOL) CMOS processes may be performed on the substrate 10.

A photoresist film (not shown) may be formed on the insulating interlayer 12. In example embodiments, the photoresist film may have a thickness of about 2 to about 5 µm. A photoresist pattern may be formed by patterning the photoresist film.

The insulating interlayer 12 and the substrate 10 may be sequentially etched using the photoresist pattern as an etching mask. Thus, a via hole 14 may be formed through the insulating interlayer 12 and at least a portion of the substrate 10.

When the via hole 14 is formed to have a depth D of less than about 10 µm, a height of a via structure 60 may be so small that the via structure 60 may not be appropriate for a stacked semiconductor device. When the via hole 14 has a depth D of more than about 100 µm, filling a conductive material into the via hole 14 may not be easy. Thus, the via hole 14 may have a depth D of about 10 to about 100 µm, for example, about 30 to about 60 µm.

When the via hole 14 has a diameter of less than about 5 µm, filling the conductive material into the via hole 14 may not be easy. When the via hole 14 has a diameter of more than about 30 µm, a cross-sectional area of the via hole 14 may increase, which may not be beneficial to a semiconductor device. Thus, the via hole 14 may have a diameter of about 5 to about 30 µm, for example, about 10 to about 20 µm.

In example embodiments, the photoresist pattern may be removed after the via hole 14 is formed.

Figure 3:
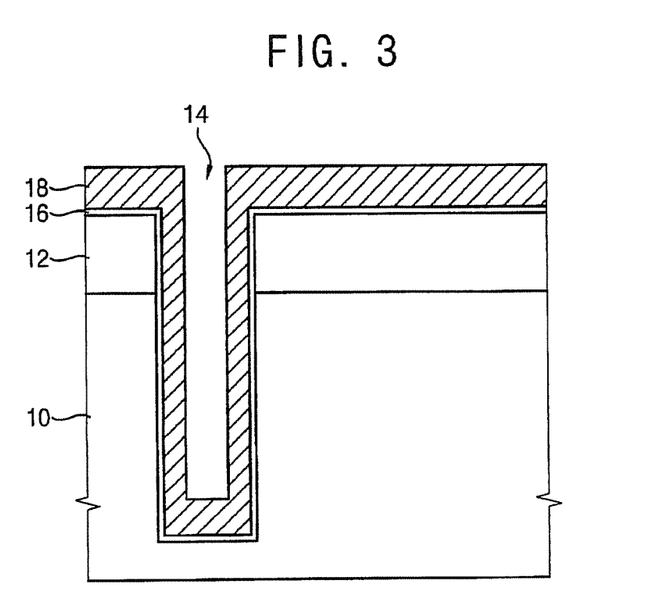

Referring to FIG. 3, an insulation layer 16 may be formed on an inner wall of the via hole 14. In example embodiments, the insulation layer 16 may be formed to have a thickness of about 1 to about 3 µm. The insulation layer 16 may insulate the substrate 10 from the conductive material subsequently filled into the via hole 14.

A first barrier layer (not shown) may be formed on the insulation layer 16. The first barrier layer may be formed using tantalum, tantalum nitride, titanium, titanium nitride, ruthenium, and/or cobalt. In example embodiments, the first barrier layer may be formed to have a thickness of about 100 to about 3000 Å.

A first seed layer (not shown) may be further formed on the first barrier layer. The first seed layer may serve as an electrode in a subsequent plating process to form a first conductive layer. In example embodiments, the first seed layer may be formed using copper by a physical vapor deposition (PVD) process.

The first conductive layer 18 may be formed on the seed layer to cover the inner wall of the via hole 14. By controlling a thickness of the first conductive layer 18, a resistance of the via structure 60 may be controlled. In example embodiments, the conductive layer 18 may be formed using a metal having a relatively low resistance. For example, the first conductive layer 18 may be formed using copper by an electroplating process.

Figure 4:
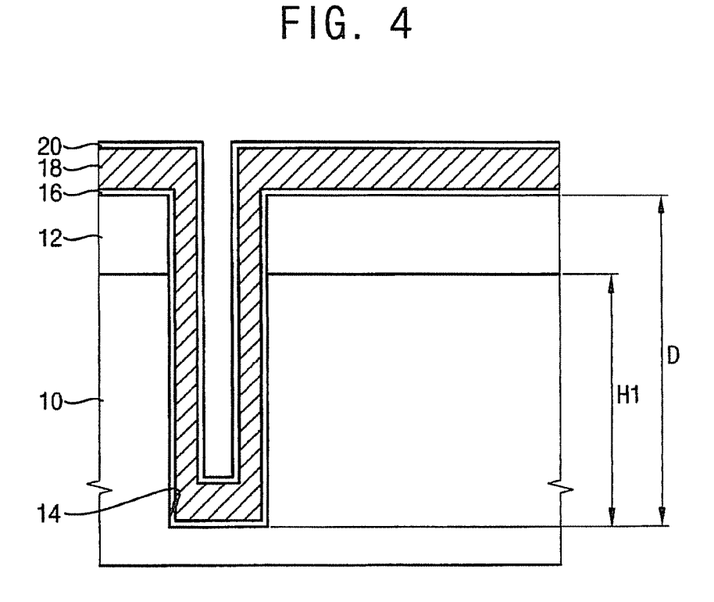

Referring to FIG. 4, a second barrier layer 20 may be formed on the first conductive layer 18. The second barrier layer 20 may be formed using tantalum, tantalum nitride, titanium, titanium nitride, ruthenium, and/or cobalt. In example embodiments, the second barrier layer 20 may be formed to have a thickness of about 100 to about 3000 Å.

Figure 5:
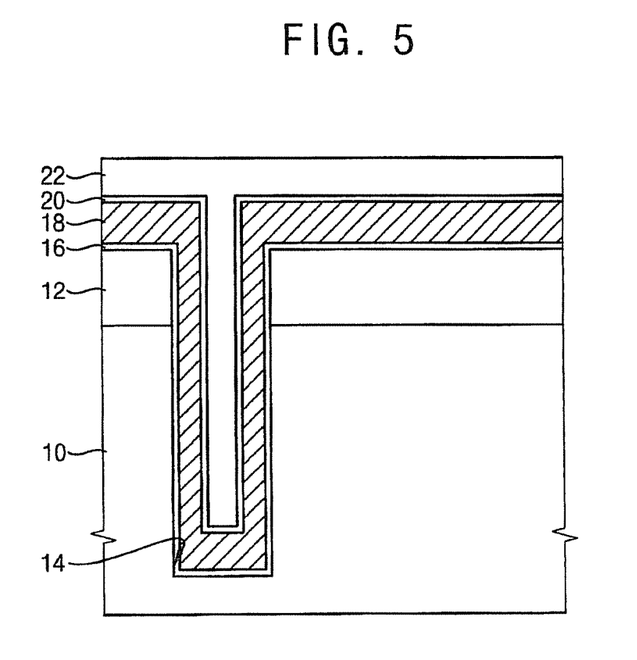

Referring to FIG. 5, a buffer layer 22 may be formed on the second barrier layer 20 to fill a remaining portion of the via hole 14. The buffer layer 22 may be formed using a material having a lower thermal expansion coefficient than that of the first conductive layer 18. In example embodiments, the buffer layer 22 may be formed using a material of which a volume decreases when heated. The buffer layer 22 may be formed using silicon, silicon oxide, or a metal. The via hole 14 may have a relatively high aspect ratio, and thus the buffer layer 22 may be formed using a material having relatively good gap-filling characteristics so that the buffer layer 22 filling via hole 14 may be relatively free of voids. In an example embodiment, the buffer layer 22 may be formed using an oxide, for example, SOG, flowable silicon, titanium, aluminum, and/or a porous material.

Figure 6:
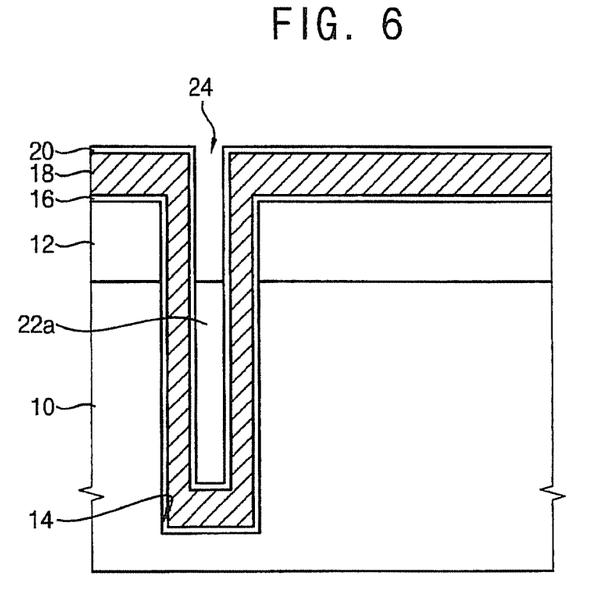

Referring to FIG. 6, an upper portion of the buffer layer 22 may be removed to form a buffer pattern 22a in the via hole 14. The buffer layer 22 may be etched by an isotropic etching process or an anisotropic etching process. In example embodiments, the buffer pattern 22a may be formed to have a top surface lower than that of the insulating interlayer 12.

In example embodiments, the buffer pattern 22a may have a first height H1 larger than about 50 percent of a depth D of the via hole 14.

Figure 7:
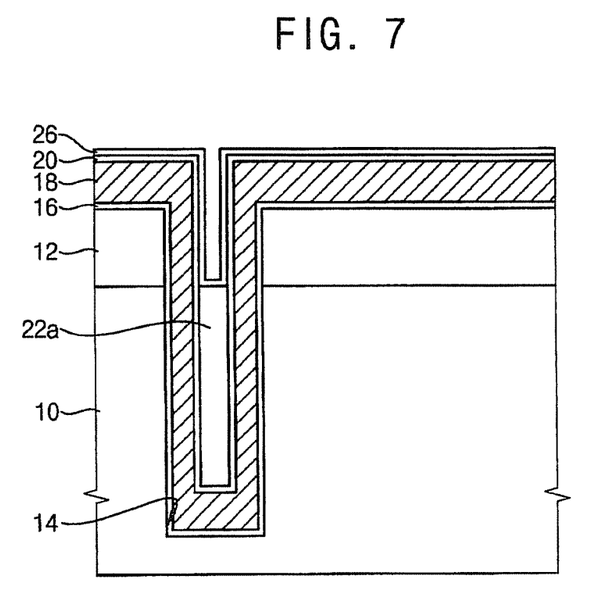

Referring to FIG. 7, a third barrier layer 26 may be formed on a top surface of the buffer pattern 22a and an exposed portion of the second barrier layer 20 above the buffer pattern 22a. The third barrier layer 26 may be formed using tantalum, tantalum nitride, titanium, titanium nitride, ruthenium, and/or cobalt. In example embodiments, the third barrier layer 26 may be formed to have a thickness of about 100 to 3000 Å.

A second seed layer (not shown) may be formed on the third barrier layer 26. In example embodiments, the second seed layer may be formed using copper by a PVD process.

Figure 8:
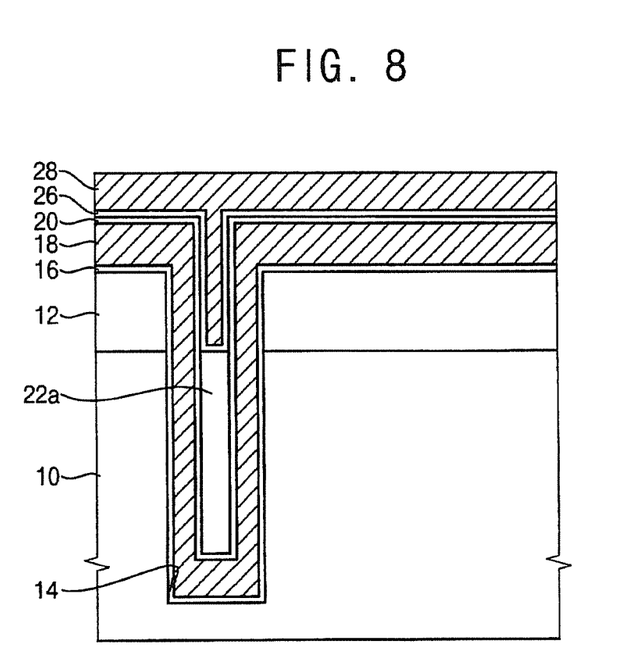

Referring to FIG. 8, a second conductive layer 28 may be formed on the second seed layer to fill a remaining portion of the via hole 14. In example embodiments, the second conductive layer 28 may be formed using a material substantially the same as that of the first conductive layer 18. For example, the second conductive layer 28 may be formed using copper by an electroplating process.

Referring to FIG. 8 again, upper portions of the second conductive layer 28, the third barrier layer 26, the second barrier layer 20, the first conductive layer 18, and the insulation layer 16 may be sequentially planarized by a chemical mechanical polishing (CMP) process and/or an etch back process until a top surface of the insulating interlayer 12 is exposed. Thus, the via structure 60 illustrated in FIG. 1 may be formed. The via structure 60 may include a first conductive pattern 18a, a second conductive pattern 28a, a first barrier layer pattern (not shown), a second barrier layer pattern 20a, a third barrier layer pattern 26a, a first insulation layer pattern 16a and the buffer pattern 22a. After the via structure 60 is formed, a capping layer 29 may be formed on the insulating interlayer 12 and the via structure 60. In example embodiments, the capping layer 29 may be formed using silicon nitride.

Figure 15:
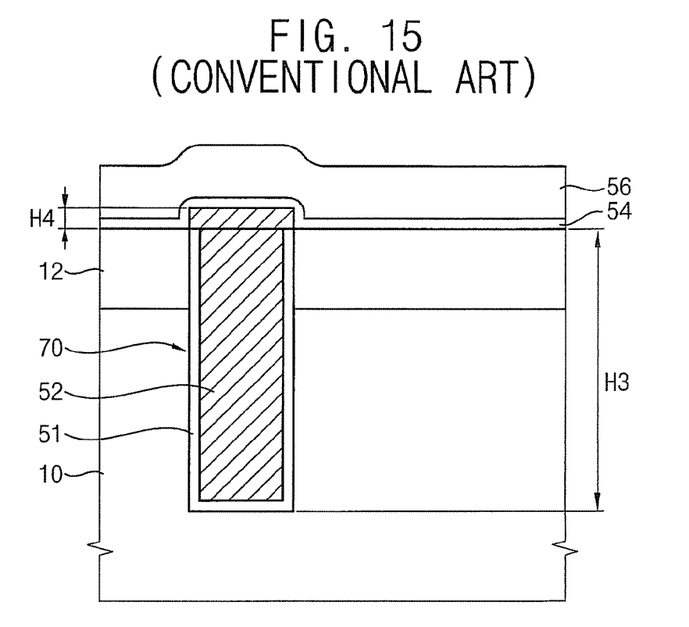
FIG. 15 is a conventional via structure in a substrate.

FIG. 15 is a conventional via structure in a substrate.

Referring to FIG. 15, the conventional via structure may have copper filling an entire via hole. When a high temperature process is performed at a temperature of higher than about 400° C., the copper in the conventional via structure may protrude upward to about 1 μm. Additionally, the protruding portion may have a cross-sectional area of several hundred square micrometers because the protruding portion may have a diameter equal to that of the via hole. Therefore, films or layers on the protruding portion may be lifted upward or have a crack therein.

According to example embodiments, the via structure 60 may have the buffer pattern 22a therein to reduce a thermal expansion of the first conductive pattern 18a. Thus, a top surface of the via structure 60 may be suppressed from protruding in high temperature processes subsequently performed.

A height of the protruding portion of the conductive material may increase in the subsequent high temperature processes. The height of the protruding portion may increase as a height of the conductive material of the via structure 60 increases. According to example embodiments, the second conductive pattern 28a may have a height H2 that is relatively small compared to a depth D of the via hole 14, thereby reducing the height of the protruding portion in the subsequent high temperature processes.

Therefore, a thermal expansion of the via structure 60 may be reduced or prevented and cracking of the layers on the via structure 60 may be reduced or prevented because of expansion and protrusion of the via structure 60.

Figure 9:
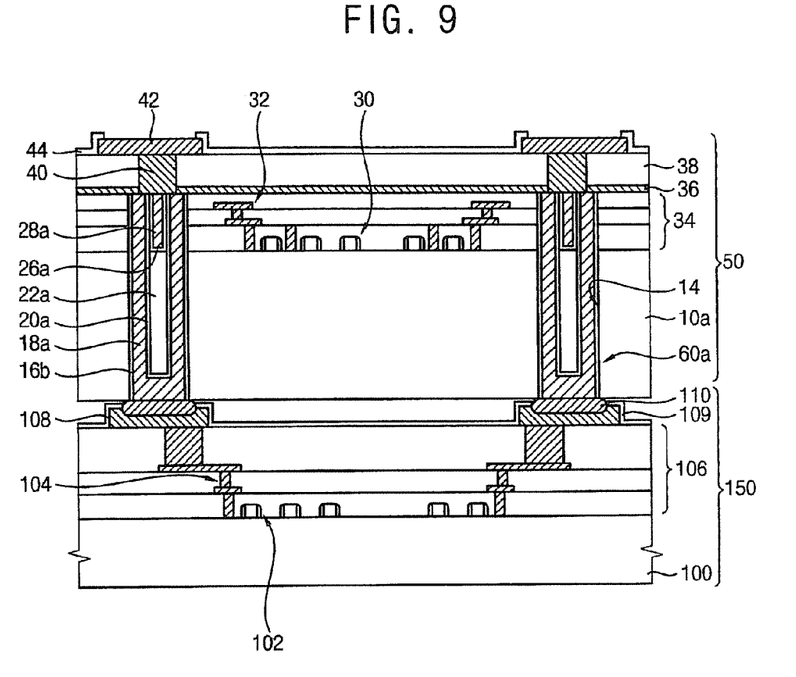
FIG. 9 is a cross-sectional view illustrating a stacked semiconductor device having a via structure in accordance with example embodiments.

FIG. 9 is a cross-sectional view illustrating a stacked semiconductor device having a via structure in accordance with example embodiments.

Referring to FIG. 9, the stacked semiconductor device may include a first semiconductor chip 50, a second semiconductor chip 150 and an adhesive material 110.

The first semiconductor chip 50 may include a first substrate 10a, circuit patterns 30 on the first substrate 10a, wirings 32, first insulating interlayers 34, a via structure 60a through the first substrate 10a and a first pad electrode 42 electrically connected to the via structure 60a.

The first substrate 10a may include a semiconductor material, for example, silicon, germanium, and silicon-germanium. In example embodiments, the first substrate 10a may include a single crystalline silicon substrate. The first substrate 10a may have a thickness of about 10 to about 100 μm. The first substrate 10a may have a bottom surface coplanar with or lower than that of the via structure 60.

The circuit patterns 30 may be formed on the first substrate 10a. The circuit patterns 30 may include semiconductor devices, for example, transistors and/or diodes. The wirings 32 may include a contact, a pad, a conduction line, etc. A device in the first semiconductor chip 50 may include a memory device, an image sensor, or a logic device.

The via structure 60a may include a second insulation layer pattern 16b, first and second conductive patterns 18a and 28a, a first barrier layer pattern (not shown), second and third barrier layer patterns 20a and 26a, first and second seed patterns (not shown) and a buffer pattern 22a.

A via hole 14 may be formed through the first substrate 10a. In an example embodiment, the via hole 14 may have a diameter of about 5 to about 30 μm, for example, about 10 to 20 μm.

The second insulation layer pattern 16b may be formed on a sidewall of the via hole 14. The second insulation layer pattern 16b may not be formed at a bottom portion of the via hole 14. Thus, the second insulation layer pattern 16b may have a cylindrical shape of which upper and bottom portions are open. The first barrier layer pattern (not shown) and the first seed pattern (not shown) may be sequentially formed on the second insulation layer pattern 16b.

The first conductive pattern 18a may be formed on the first seed layer and at a bottom portion of the via hole 14. That is, the bottom portion of the via hole 14 may be covered with a bottom surface of the first conductive pattern 18a. The bottom surface of the first conductive pattern 18a may be coplanar with the bottom surface of the first substrate 10a. In example embodiments, the first conductive pattern 18a may include a metal, for example, copper.

The second barrier layer pattern 20a may be formed on the first conductive pattern 18a. The buffer pattern 22a may be formed on the second barrier layer pattern 20a, and partially fill the via hole 14. The buffer pattern 22a may have a structure substantially the same as that illustrated with reference to FIG. 1.

The third barrier layer pattern 26a and the second seed pattern (not shown) may be formed on a top surface of the buffer pattern 22a and a sidewall of the second barrier layer pattern 20a. The second conductive pattern 28a may be formed on the second seed pattern, and fill a remaining portion of the via hole 14.

As illustrated above, the via structure 60a may be formed in the via hole 14 through the substrate 10. The via structure 60a may be substantially the same as that explained with reference to FIG. 1, except that the second insulation layer pattern 16b is not formed at the bottom portion of the via hole 14 and that the bottom surface of the first conductive pattern 18a may be exposed.

A capping layer 36 may be formed on the via structure 60a and the first insulating interlayer 34. The capping layer 36 may prevent diffusion of a metal of the via structure 60a, and may protect the via structure 60a. Additionally, the capping layer 36 may serve as an etch stop layer. In example embodiments, the capping layer 36 may include silicon nitride.

A second insulating interlayer 38 may be formed on the capping layer 36. A contact plug 40 may be formed through the second insulating interlayer 38 and the capping layer 36 and make contact with a top surface of the via structure 60a.

The first pad electrode 42 may be formed on the contact plug 40. External signals may be applied to the first pad electrode 42. A first protection layer pattern 44 may be formed on the second insulating interlayer 38 and the first pad electrode 42. In example embodiments, the first protection layer pattern 44 may include polyimide. The first protection layer pattern 44 may not be formed on a portion of the first pad electrode 42 which may make electrical connection to external terminals. The first pad electrode 42 may make contact with a printed circuit board (PCB) or may be electrically connected to a lead frame using a wire bonding.

The second semiconductor chip 150 may include a second substrate 100, circuit patterns 102 on the second substrate 100, wirings 104, third insulating interlayers 106 and a second pad electrode 108 to which external signals may be applied through the via structure 60a.

The second semiconductor chip 150 may include a semiconductor device substantially the same as or different from that of the first semiconductor chip 50.

As illustrated in FIG. 9, the second pad electrode 108 may be formed on the third insulating interlayer 106 and may be formed to connect with the wirings 104. In example embodiments, the second pad electrode 108 may contact and may be electrically connected to a bottom surface of the via structure 60a of the first substrate 10a.

The second protection layer pattern 109 may be formed on the third insulating interlayer 106 and the second pad electrode 108. In example embodiments, the second protection layer pattern 109 may include polyimide. The second protection layer pattern 109 may not be formed on a portion of the second pad electrode 108 which may make contact with the via structure 60a.

The adhesive material 110 may be interposed between the via structure 60a of the first semiconductor chip 50 and the second pad electrode 108 of the second semiconductor chip 150. By the adhesive material 110, the via structure 60a may be attached to the second pad electrode 108. In example embodiments, the adhesive material 110 may include silver solder paste.

According to example embodiments, the semiconductor device may have a stacked structure of the first and second semiconductor chips 50 and 150, and the first chip 50 may be electrically connected to the second chip 150 through the via structure 60a. The via structure 60a may have a relatively good thermal stability and improved reliability.

FIGS. 10 to 14 are cross-sectional views illustrating a method of manufacturing the stacked semiconductor device in FIG. 9.

Figure 10:
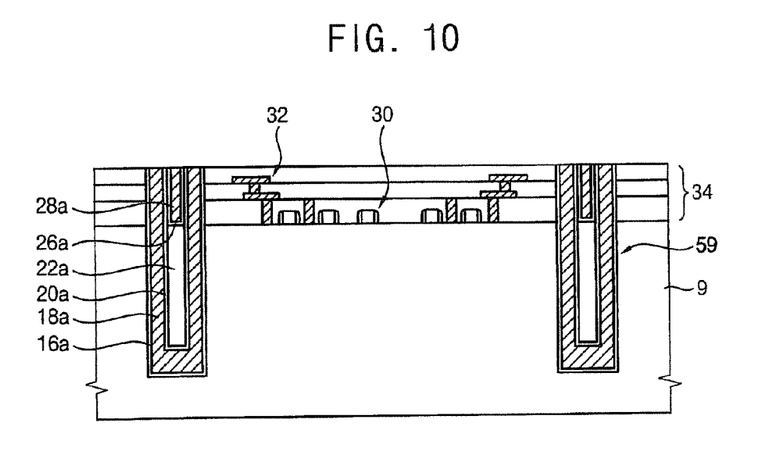
FIGS. 10 to 14 are cross-sectional views illustrating a method of manufacturing the stacked semiconductor device in FIG. 9.

Referring to FIG. 10, circuit patterns 30, wirings 32 and first insulating interlayers 34 may be formed on a first preliminary substrate 9. A preliminary via structure 59 may be formed through the first insulating interlayers 34 and at least a portion of the first preliminary substrate 9. The preliminary via structure 59 may have a structure substantially the same as that of the via structure 60 illustrated above with reference to FIG. 1, and may be formed by substantially the same processes illustrated above with reference to FIGS. 2 to 8.

Figure 11:
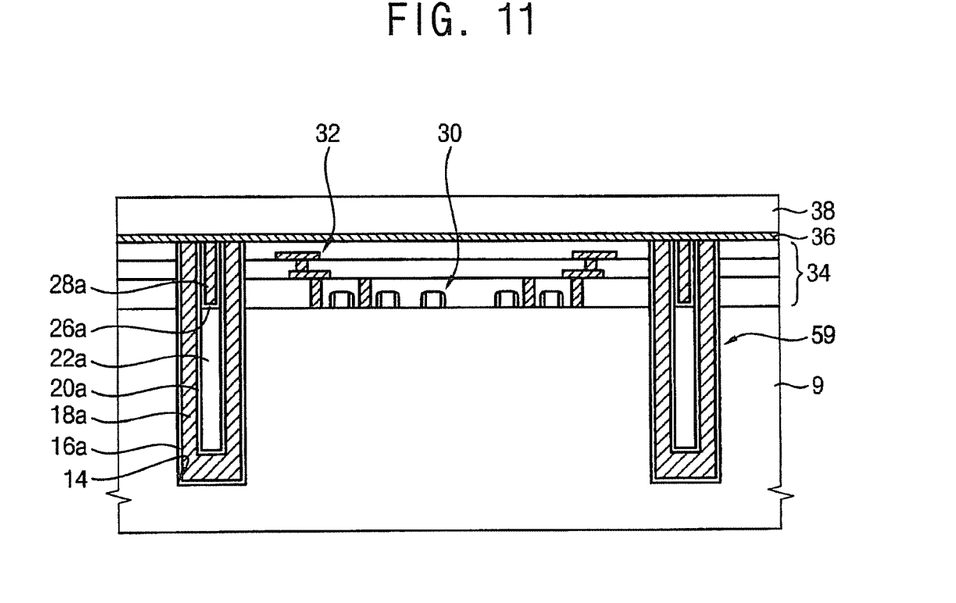

Referring to FIG. 11, a capping layer 36 may be formed on the first insulating interlayer 34 and the preliminary via structure 59. In example embodiments, the capping layer 36 may be formed to have a thickness of about 300 to about 1000 Å.

A second insulating interlayer 38 may be formed on the capping layer 36. In example embodiments, the second insulating interlayer 38 may be formed to have at least one layer.

According to example embodiments, the preliminary via structure 59 may include a buffer pattern 22a therein, so that the preliminary via structure 59 may not protrude above the first preliminary substrate 9. Thus, the capping layer 36 and the second insulating interlayer 38 covering the preliminary via structure 59 may be prevented from lifting upward or having cracks therein or, in the alternative, the lifting or cracking of the second insulation interlayer 38 may be reduced or minimized.

Figure 12:
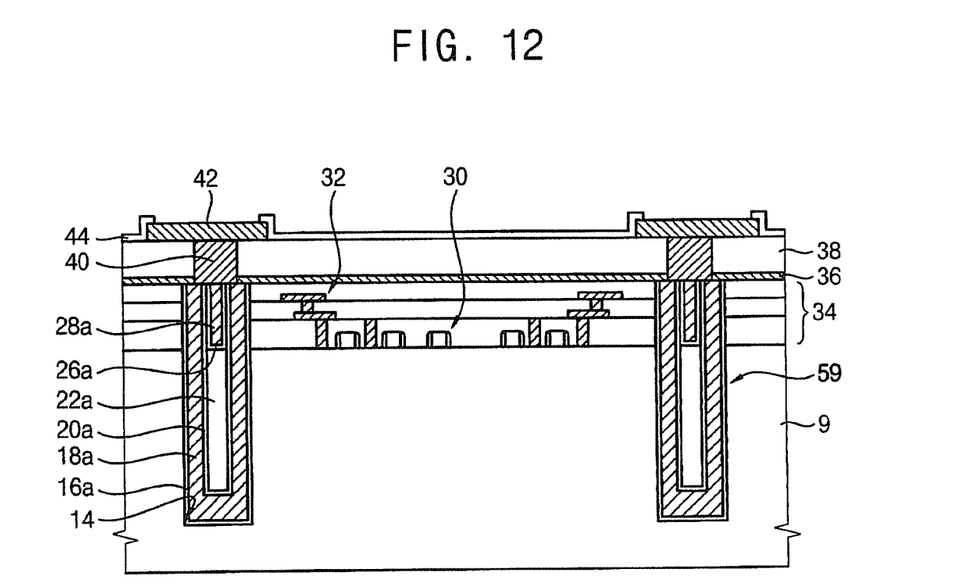

Referring to FIG. 12, a contact hole (not shown) may be formed through the second insulating layer 38 and the capping layer 36 to expose a top surface of the preliminary via structure 59. In example embodiments, the contact hole may be formed by an etching process. A contact plug 40 may be formed to fill the contact hole. The contact plug 40 may be formed using a conductive material. In example embodiments, the conductive material may include a metal having a relatively low resistance.

A first pad electrode 42 may be formed on the second insulating interlayer 38 to make contact with the contact plug 40. In example embodiments, the first pad electrode 42 may be formed using a metal having a relatively low resistance.

A first protection layer may be formed on the second insulation layer 38 to cover the first pad electrode 42. An upper portion of the first protection layer on the first pad electrode 42 to which external signals may be applied may be removed to form a first protection layer pattern 44.

Figure 13:
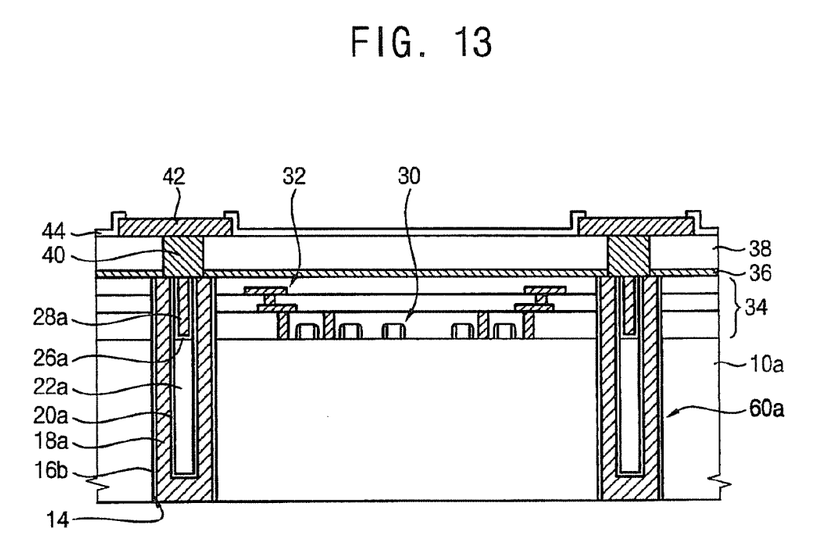

Referring to FIG. 13, lower portions of the preliminary first substrate 9 and the first insulation layer pattern 16a may be removed until the first conductive pattern 18 of the preliminary via structure 59 is exposed, and thus a first substrate 10a and a via structure 60a may be formed.

The first preliminary substrate 9 may be ground so that a bottom surface of the preliminary via structure 59 may be close to the bottom surface of the first preliminary substrate 9, e.g., at a distance of about few micrometers. The first preliminary substrate 9 may be etched to expose the first insulation layer pattern 16a at a bottom portion of the preliminary via structure 59. The first substrate 10a exposing the first conductive pattern 18a may be formed by etching the first preliminary substrate 9 and the first insulation layer pattern 16a so that a bottom surface of the first conductive pattern 18 may be exposed.

Thus, a second isolation layer pattern 16b may be formed to cover a sidewall of the via hole 14.

When the preliminary via structure 60a has a relatively small height, a thickness of a stacked semiconductor device may be decreased. However, as the height of the preliminary via structure 60a decreases, the first preliminary substrate 59 may be removed more by grinding and etching processes.

Figure 14:
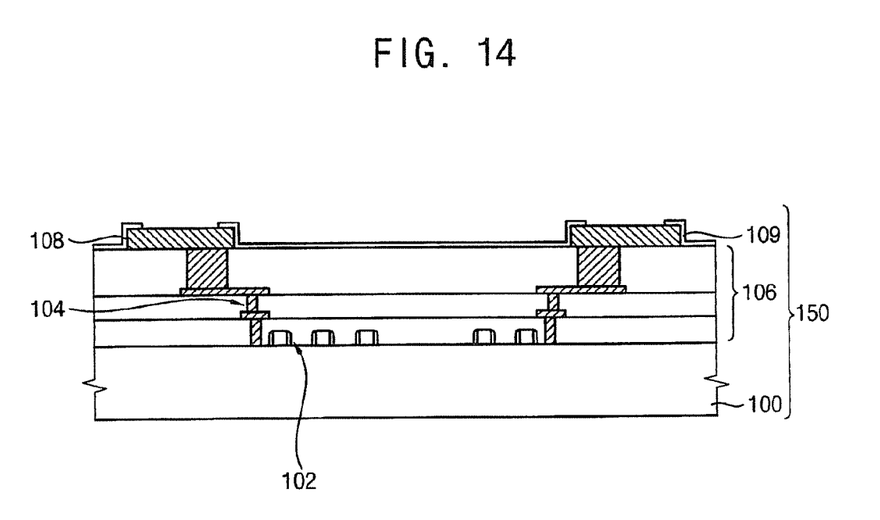

Referring to FIG. 14, circuit patterns 102, wirings 104, third insulating interlayers 106 may be formed on a second substrate 100.

A second pad electrode 108 may be formed on the third insulating interlayer 106 to make contact with the wirings 104. The second pad electrode 108 may be formed at a portion on the third insulation interlayer 106 corresponding to the position of the via structure 60a of the first substrate 10a.

A second protection layer may be formed on the third insulating interlayer 106 to cover the second pad electrode 108. An upper portion of the second protection layer on the second pad electrode 108 to which external signals may be applied may be removed to form a second protection layer pattern 109.

Referring to FIG. 9 again, an adhesive material 110 may be formed on the second pad electrode 108 of the second substrate 100, and the adhesive material 110 may make contact with the bottom surface of the via structure 60a of the first substrate 10a. The adhesive material 110 may be a conductive material. As illustrated above, the stacked semiconductor device having the first and second semiconductor chips 50 and 150 may be manufactured.

FIG. 15 is a cross-sectional view illustrating a conventional via structure.

Referring to FIG. 15, an insulation layer pattern 51 and a barrier layer pattern (not shown) may be formed on an inner wall of a via hole. A copper pattern 52 may be formed on the barrier layer pattern to fill the via hole. A capping layer 54 and a second insulating interlayer 56 may be formed on a first insulating interlayer 12 and the via structure 70.

Copper Protrusion Experiment

Comparative Examples 1 to 3, each of which has the via structure of FIG. 15, were formed. The via structures of Comparative Examples 1 to 3 had diameters substantially the same as and different third heights H3 from one another.

Ratios of the third heights H3 with respect to the diameters of Comparative Examples 1 to 3 are illustrated below.

|  | Diameter:Height |
| --- | --- |
| Comparative Example 1 | 2:1.7 |
| Comparative Example 2 | 2:4.3 |
| Comparative Example 3 | 2:5.0 |

Comparative Examples 1 to 3 were heated at a temperature of about 450° C. for about 30 minutes. Fourth heights H4 of protruding portions of copper patterns 52 above the capping layer 54 were measured for Comparative Examples 1 to 3.

Figure 16:
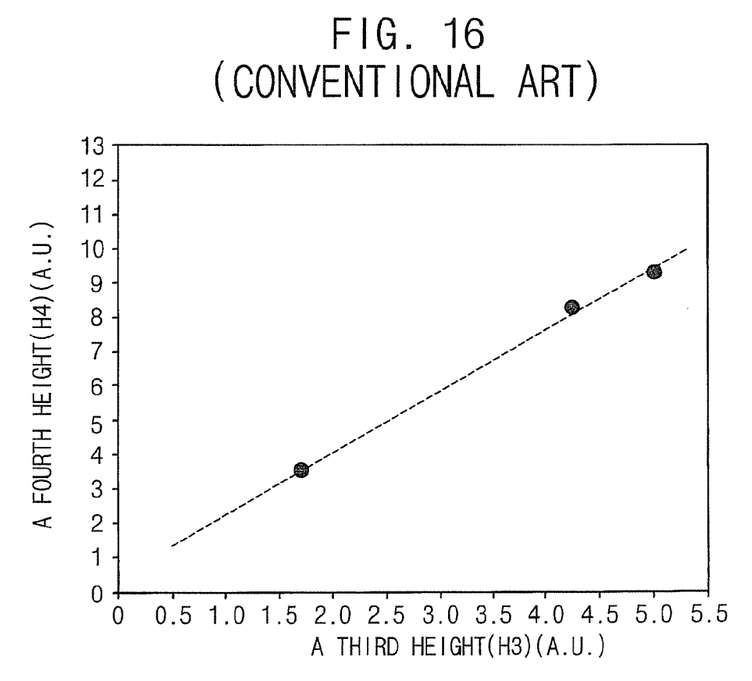
FIG. 16 is a graph illustrating a fourth height H4 of a protruding portion of a copper pattern in each Comparative Example.

FIG. 16 is a graph illustrating the fourth height H4 of the protruding portion of the copper pattern 32 in each Comparative Example.

Referring to FIG. 16, according as the third height H3 of the copper pattern 32 in the via structure increases, the fourth height H4 of the protruding portion of the copper pattern 32 increases linearly.

Particularly, Comparative Example 3 was formed to have a diameter of about 20 μm and a third height H3 of about 50 μm. After the heat treatment at a temperature of about 450° C. for 30 minutes, the protruding portion of the copper pattern 32 had a fourth height H4 of about 0.9 μm.

According to the experiment, when the third height H3 of the copper pattern decreases, the fourth height H4 of the protruding portion of the copper pattern 32 may decrease.

Simulation of Copper Protrusion

An example (hereinafter "Example") having the via structure 60 of FIG. 1 was manufactured by performing processes substantially the same as or similar to those illustrated with reference to FIGS. 2 to 8.

Particularly, the via hole 14 was formed to have a diameter of about 20 μm and a depth D of about 50 μm. The first conductive pattern 18a was formed using copper to have a thickness of about 5 μm by a deposition process and a subsequent grinding process. The buffer pattern 22a was formed using a SOG material to have a thickness of about 35 μm by a deposition process and a subsequent etching process. The second conductive pattern 28a was formed on the buffer pattern 22a to have a thickness of about 10 μm using copper by a deposition process and a subsequent grinding process. The second conductive pattern 28a was formed to have a second height H2 of about 10 μm.

The via structure 60 was heated at a temperature of about 450° C. for 30 minutes.

A height of a protruding portion of the first and second conductive patterns 18a and 28a was calculated.

The second conductive pattern 28a had a thickness of about 10 μm. That is, a depth of copper filled into the via hole 14 to form the second conductive pattern 28a was about 10 μm. Thus, a height of a protruding portion of Example may be substantially the same as or similar to that of a copper pattern which fills a via hole having a depth of about 10 μm. The height of the protruding portion of the second conductive pattern 28a was calculated to be about 0.2 μm after a heat treatment at a temperature of about 450° C. for 30 minutes.

As illustrated above, the protruding portion of the via structure 60 according to Example had a height of about 0.2 μm, when the via structure 60 has a diameter of about 20 μm and a depth of about 50 μm. However, in Comparative Example 3 of which the copper pattern had a diameter of about 20 μm and a depth of about 50 μm, the protruding portion of the copper pattern had a height of about 0.9 μm.

Accordingly, the via structure 60 in accordance with Example may protrude less in a high temperature process than that of the conventional via structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A via structure comprising:
   a first conductive pattern on an inner wall of a first substrate, the inner wall defining via hole passing at least partially through the first substrate;
   a buffer pattern on the first conductive, the buffer pattern partially filling the via hole; and
   a second conductive pattern on the top surface of the buffer pattern in the via hole,
   wherein the buffer pattern is completely under the second conductive pattern.

2. The via structure of claim 1, further comprising:
   a first barrier layer pattern between the first conductive pattern and the buffer pattern.

3. The via structure of claim 1, further comprising:
   a second barrier layer pattern under the second conductive pattern.

4. The via structure of claim 1, wherein the buffer pattern includes a material having a lower thermal expansion coefficient than that of the first conductive pattern.

5. The via structure of claim 4, wherein the buffer pattern includes at least one of a silicon, an oxide, and a metal.

6. The via structure of claim 1, wherein the first conductive pattern is also on an inner wall of a first insulating interlayer, the first insulating interlayer being on the first substrate, the inner wall of the first insulating interlayer defining a via hole passing through the first insulating interlayer.

7. The via structure of claim 6, wherein the via hole passing through the first insulating interlayer is above the via hole passing at least partially through the first substrate.

8. The via structure of claim 7, further comprising:
   a capping layer on the first insulating interlayer, the first conductive pattern, and the second conductive pattern.

9. The via structure of claim 1, wherein the first and second conductive patterns include copper.

10. The via structure of claim 1, wherein the via hole has a depth of about 10 to about 100 μm.

11. A semiconductor device comprising:
    the via structure according to claim 1; and
    a second substrate under the via structure, the second substrate including a circuit pattern having a pad electrode facing the first conductive pattern, wherein
    the via hole extends through the first substrate, the first conductive pattern has a cup-shaped inner wall and a bottom surface exposed through the via hole, and the bottom surface of the first conductive pattern is connected to the pad electrode via a conductive structure.

12. The via structure of claim 1, wherein the width of the buffer pattern is substantially the same as that of the second conductive pattern.

13. The via structure of claim 1, wherein the sidewall of the second conductive pattern faces the first conductive pattern, the buffer pattern being not interposed therebetween.

* * * * *